(12) United States Patent
Akiba

(10) Patent No.: US 11,843,228 B2
(45) Date of Patent: Dec. 12, 2023

(54) ELECTRICAL CONNECTION BOX

(71) Applicant: SUMITOMO WIRING SYSTEMS, LTD., Mie (JP)

(72) Inventor: Kosuke Akiba, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 526 days.

(21) Appl. No.: 17/059,237

(22) PCT Filed: Apr. 2, 2019

(86) PCT No.: PCT/JP2019/014697
§ 371 (c)(1),
(2) Date: Nov. 26, 2020

(87) PCT Pub. No.: WO2019/239686
PCT Pub. Date: Dec. 19, 2019

(65) Prior Publication Data
US 2021/0203137 A1 Jul. 1, 2021

(30) Foreign Application Priority Data
Jun. 11, 2018 (JP) .................................. 2018-111308

(51) Int. Cl.
*B60R 16/023* (2006.01)
*H02B 1/56* (2006.01)
*H02B 1/48* (2006.01)

(52) U.S. Cl.
CPC ........... *H02B 1/56* (2013.01); *B60R 16/0239* (2013.01); *H02B 1/48* (2013.01)

(58) Field of Classification Search
CPC .................................................. B60R 16/0239
See application file for complete search history.

(56) References Cited

U.S. PATENT DOCUMENTS

| 2003/0184969 A1 | 10/2003 | Itabashi et al. |
| 2016/0021789 A1 | 1/2016 | Negishi et al. |
| 2018/0009072 A1* | 1/2018 | Kittel ....................... B23P 15/26 |
| 2018/0228047 A1* | 8/2018 | Ota ..................... H05K 7/14329 |

(Continued)

FOREIGN PATENT DOCUMENTS

| JP | H11-307954 A | 11/1999 |
| JP | 2001-326306 A | 11/2001 |

(Continued)

OTHER PUBLICATIONS

International Search Report dated Jun. 18, 2019 for WO 2019/239686 A1 (4 pages).

*Primary Examiner* — Hung V Ngo
(74) *Attorney, Agent, or Firm* — Venjuris, P.C.

(57) ABSTRACT

Provided is an electrical connection box 10 that includes a box main body 12 having a surface 14 provided with a component mounting portion 22 in which an electrical component 30 is mounted; and a cover member 16 covering the surface 14 of the box main body 12, in which an inner surface 48 of a top wall portion 42 of the cover member 16 is provided with a heat dissipation member holding portion 52 that protrudes toward the electrical component 30, and a plastic heat dissipation member 64 held by the heat dissipation member holding portion 52 is made to come into contact with a surface 66 of the electrical component 30.

6 Claims, 6 Drawing Sheets

(56) References Cited

U.S. PATENT DOCUMENTS

| | | | |
|---|---|---|---|
| 2020/0100353 A1* | 3/2020 | Tanaka | H05K 5/0043 |
| 2020/0194159 A1* | 6/2020 | Tsuchida | H01F 27/2852 |
| 2020/0381905 A1* | 12/2020 | Sasaki | H05K 5/0213 |
| 2022/0278515 A1* | 9/2022 | Okuhira | H02G 3/16 |
| 2023/0120275 A1* | 4/2023 | Hamai | H01R 13/688 |
| | | | 323/282 |

FOREIGN PATENT DOCUMENTS

| | | |
|---|---|---|
| JP | 2007-295706 A | 11/2007 |
| JP | 2010-225674 A | 10/2010 |
| JP | 2012-200141 A | 10/2012 |

\* cited by examiner

ELECTRICAL CONNECTION BOX

CROSS REFERENCE TO RELATED APPLICATIONS

This application is a national phase of PCT application No. PCT/JP2019/014697, filed on 2 Apr. 2019, which claims priority from Japanese patent application No. 2018-111308, filed on 11 Jun. 2018, all of which are incorporated herein by reference.

TECHNICAL FIELD

The present disclosure relates to an electrical connection box to be mounted in an automobile or the like, and in particular relates to an electrical connection box including a cover member for covering a surface of a box main body.

BACKGROUND

Conventionally, electrical connection boxes such as relay boxes, fuse boxes, and junction boxes have been used in an electric system of an automobile, and streamlining of electrical wiring and an increase in maintainability, such as exchanging of electrical wiring, are achieved by arranging multiple electrical components such as relays and fuses in a concentrated manner in the electrical connection box.

PRIOR ART DOCUMENT

Patent Document

Patent Document 1: JP H11-307954A
Patent Document 2: JP 2007-295706A

SUMMARY OF THE INVENTION

Problems to be Solved

Incidentally, as disclosed in Japanese Patent Laid-Open Publication No. H11-307954 (Patent Document 1) and the like, an electrical connection box includes a box main body that accommodates an internal circuit constituted by bus bars, a printed circuit board, and the like. A surface of the box main body is provided with multiple component mounting portions in which electrical components are to be mounted, and the surface of the box main body is covered by a cover member.

However, the number of highly heat generating components, such as fuses and relays, has increased accompanying the recent increase in the number of automotive electronic components, and the size of the electrical connection box has been limited based on the spatial relationship of the installation location, and the concentration of heat-generating components in the electrical connection box has also increased. In particular, the amount of heat generated by the fusible portions of fuses and coil portions of relays is extremely high. For this reason, heat is likely to be trapped in the hermetically-sealed electrical connection box and local overheating occurs, and thus there has been a risk of harming the function of the fuses and the relays.

To address this, a configuration is adopted in which a heat dissipation member is fixed to an inner surface of a cover member, and the heat dissipation member is in contact with the surfaces of the fuses in a state in which the upper surface of the box main body is covered. Japanese Patent Laid-Open Publication No. 2007-295706 (Patent Document 2) discloses a method for releasing heat generated by the fuses through this contact therebetween, for example. However, the heat dissipation member is made of an elastic resin, and thus, in order to bring the heat dissipation member into contact with a surface of an electrical component, the heat dissipation member needs to be pressed against the electrical component with a comparatively large force. Thus, there is a risk that the electrical component will be damaged.

In view of this, an object is to provide an electrical connection box with a new structure according to which it is possible to stably bring a heat dissipation member into contact with a surface of an electrical component while reducing the contact pressure of a heat dissipation member applied to the electrical component.

Means to Solve the Problem

An electrical connection box of this disclosure includes a box main body having a surface provided with a component mounting portion in which an electrical component is mounted, and a cover member covering the surface of the box main body, in which an inner surface of a top wall portion of the cover member is provided with a heat dissipation member holding portion that protrudes toward the electrical component, and a plastic heat dissipation member held by the heat dissipation member holding portion is made to come into contact with a surface of the electrical component.

Effect of the Invention

According to this disclosure, it is possible to avoid or reduce the risk that electrical components will be damaged, and to efficiently release heat generated by the electrical components to the outside of an electrical connection box via a plastic heat dissipation member and a cover member.

DETAILED DESCRIPTION TO EXECUTE THE INVENTION

Embodiment of the Present Disclosure

Figure 1:
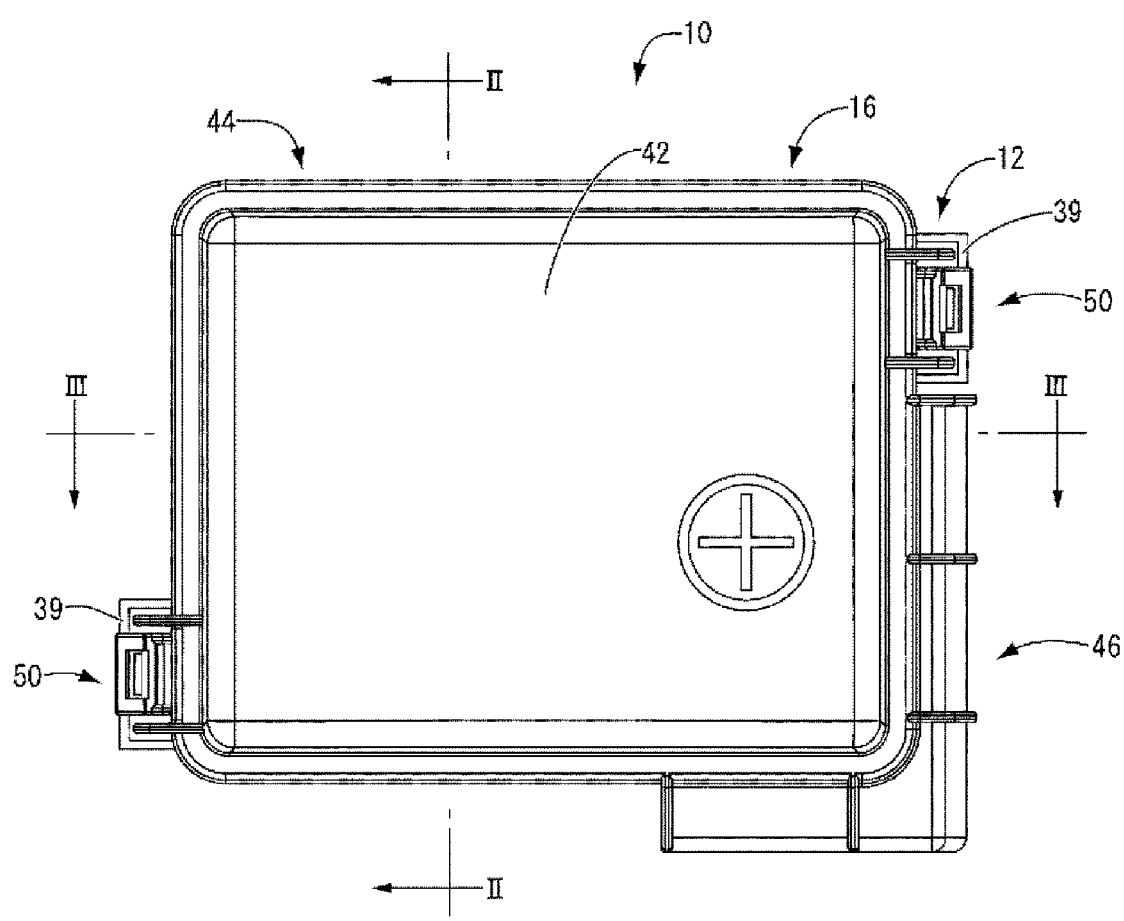
FIG. 1 is a plan view showing an electrical connection box according to Embodiment 1.

First, embodiments of the present disclosure will be listed and described.

An electrical connection box of this disclosure is:

(1) an electrical connection box including a box main body having a surface provided with a component mounting portion in which an electrical component is mounted, and a cover member covering the surface of the box main body, in which an inner surface of a top wall portion of the cover member is provided with a heat dissipation member holding portion that protrudes toward the electrical component, and a plastic heat dissipation member held by the heat dissipation member holding portion is made to come into contact with a surface of the electrical component.

According to the electrical connection box of this disclosure, the inner surface of the top wall portion of the cover member is provided with a heat dissipation member holding portion that protrudes toward an electrical component, and a plastic heat dissipation member that has plasticity and is held by the heat dissipation member holding portion is in contact with the surface of the electrical component. Because the heat dissipation member has plasticity, it is possible to reduce the contact pressure of the plastic heat dissipation member that is brought into contact with the surface of the electrical component. Also, it is possible to stably bring the plastic heat dissipation member into contact with the surface of the electrical component by deforming the plastic heat dissipation member along the surface of the electrical component. Thus, it is possible to avoid or reduce the risk that electrical components will be damaged, and to efficiently release heat generated by the electrical components to the outside of an electrical connection box via a plastic heat dissipation member and a cover member.

Note that a silicone putty sheet for heat dissipation that is in a clay-like state and favorably adheres to unevenness, silicone grease for heat dissipation, or the like can be adopted as a heat dissipation member having plasticity, for example.

(2) It is preferable that the heat dissipation member holding portion includes a tubular peripheral wall portion that protrudes from the inner surface of the top wall portion toward the box main body side, and an axial portion that is located in an inner portion of the peripheral wall portion and extends in an axial direction of the peripheral wall portion, and a portion of the plastic heat dissipation member protrudes from the heat dissipation member holding portion toward the electrical component, and is made to come into contact with the surface of the electrical component.

The heat dissipation member holding portion includes the tubular peripheral wall portion and the axial portion that is arranged in the inner portion of the peripheral wall portion. Thus, by pushing the plastic heat dissipation member in between the peripheral wall portion and the axial portion to fill a portion therebetween with the plastic heat dissipation member, it is possible to dispose the plastic heat dissipation member at a predetermined position and maintain contact with the plastic heat dissipation member due to the peripheral wall portion and the axial portion. This makes it possible to prevent the plastic heat dissipation member from coming off from the heat dissipation member holding portion and falling downward, and to reliably and stably hold the plastic heat dissipation member. Also, a portion of the plastic heat dissipation member that protrudes from the heat dissipation member holding portion is made to come into contact with the surface of the electrical component. Therefore, it is possible to bring the plastic heat dissipation member into contact with the surface of the electrical component without deteriorating the plasticity of the plastic heat dissipation member. As a result, it is possible to advantageously realize effects such as a reduction in contact pressure and an increase in the area of contact with an electrical component.

(3) It is preferable that the peripheral wall portion has a cylindrical shape, and the axial portion is arranged concentrically therewith.

Because the heat dissipation member holding portion has a cylindrical peripheral wall portion, the heat dissipation member holding portion can be readily filled with the plastic heat dissipation member that is pushed into the inner portion without gaps. Thus, it is possible to reliably ensure the area of contact between the peripheral wall portion and the plastic heat dissipation member, and the heat dissipation member holding portion can advantageously and stably hold the plastic heat dissipation member. In addition, it is possible to more evenly dispose and accommodate the plastic heat dissipation member in the inner portion of the peripheral wall portion because the axial portion and the peripheral wall portion are arranged concentrically. As a result, the plastic heat dissipation member can be advantageously and stably held.

(4) It is preferable that a rib extending in parallel to the axial direction protrudes from an inner surface of the peripheral wall portion.

The plastic heat dissipation member is guided by the rib and is smoothly pressed into the inner portion of the peripheral wall portion of the heat dissipation member holding portion because the rib extending in parallel to the axial direction protrudes from the inner surface of the peripheral wall portion. Also, because the area of contact between the plastic heat dissipation member and the peripheral wall portion is increased by the rib, the plastic heat dissipation member is more advantageously prevented from coming off from the heat dissipation member holding portion and falling downward.

(5) It is preferable that a leading end portion of the axial portion extends further toward the box main body side than a protruding end portion of the peripheral wall portion does.

The leading end portion of the axial portion extends further toward the box main body side than the protruding end portion of the peripheral wall portion does. Accordingly, it is possible to position and stably hold a portion of the plastic heat dissipation member that protrudes from the heat dissipation member holding portion toward an electrical component and is in contact with a surface of the electrical component. Therefore, it is possible to reliably bring the plastic heat dissipation member into contact with the surface of the electrical component.

(6) It is preferable that the leading end portion of the axial portion has a tapered portion that tapers off toward the box main body side.

The leading end portion of the axial portion has a tapered portion that tapers off toward the box main body side. Therefore, it is possible to smoothly push the plastic heat dissipation member into the inner portion of the peripheral wall portion of the heat dissipation member holding portion, using the axial portion as a guide.

(7) It is preferable that the tapered portion of the axial portion has a wide portion whose size in a direction perpendicular to the axis is larger than that of the axial portion, and a step surface is formed between the wide portion and the axial portion.

The tapered portion of the axial portion has a wide portion whose size in a direction perpendicular to the axis is larger than that of the axial portion, and a step surface is formed between the wide portion and the axial portion. Accordingly, the tapered portion exerts an anchor function, and it is possible to more stably hold a portion of the plastic heat dissipation member that protrudes from the heat dissipation member holding portion.

Details of Embodiments of the Present Disclosure

A specific example of the electrical connection box of the present disclosure will be described hereinafter with reference to the drawings. Note that the present disclosure is not limited to these examples, but are indicated by the claims, and all changes that come within the meaning and range of equivalency of the claims are intended to be embraced therein.

Figure 2:
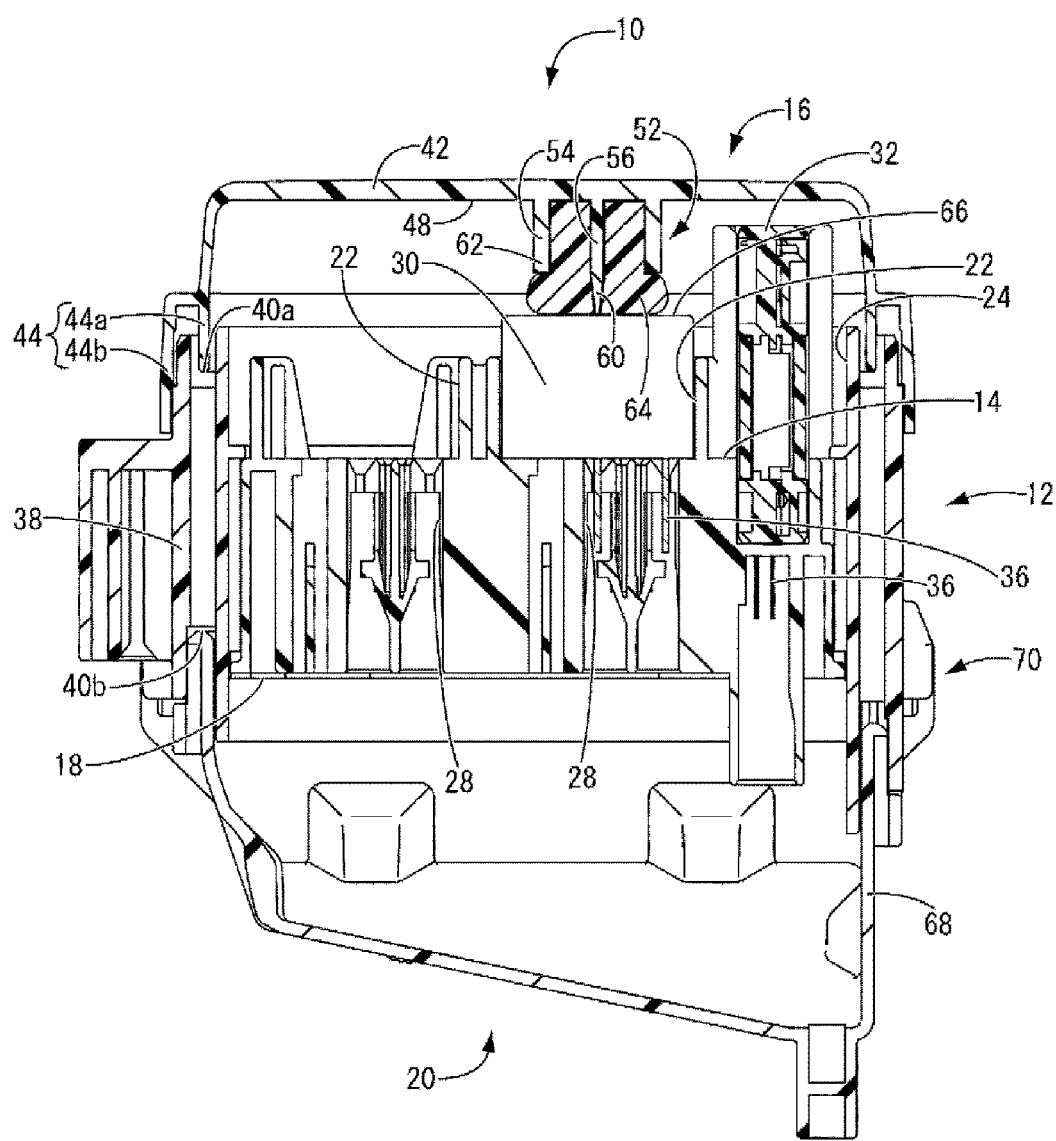
FIG. 2 is an expanded view of a cross-section taken along line II-II in FIG. 1.
Figure 3:
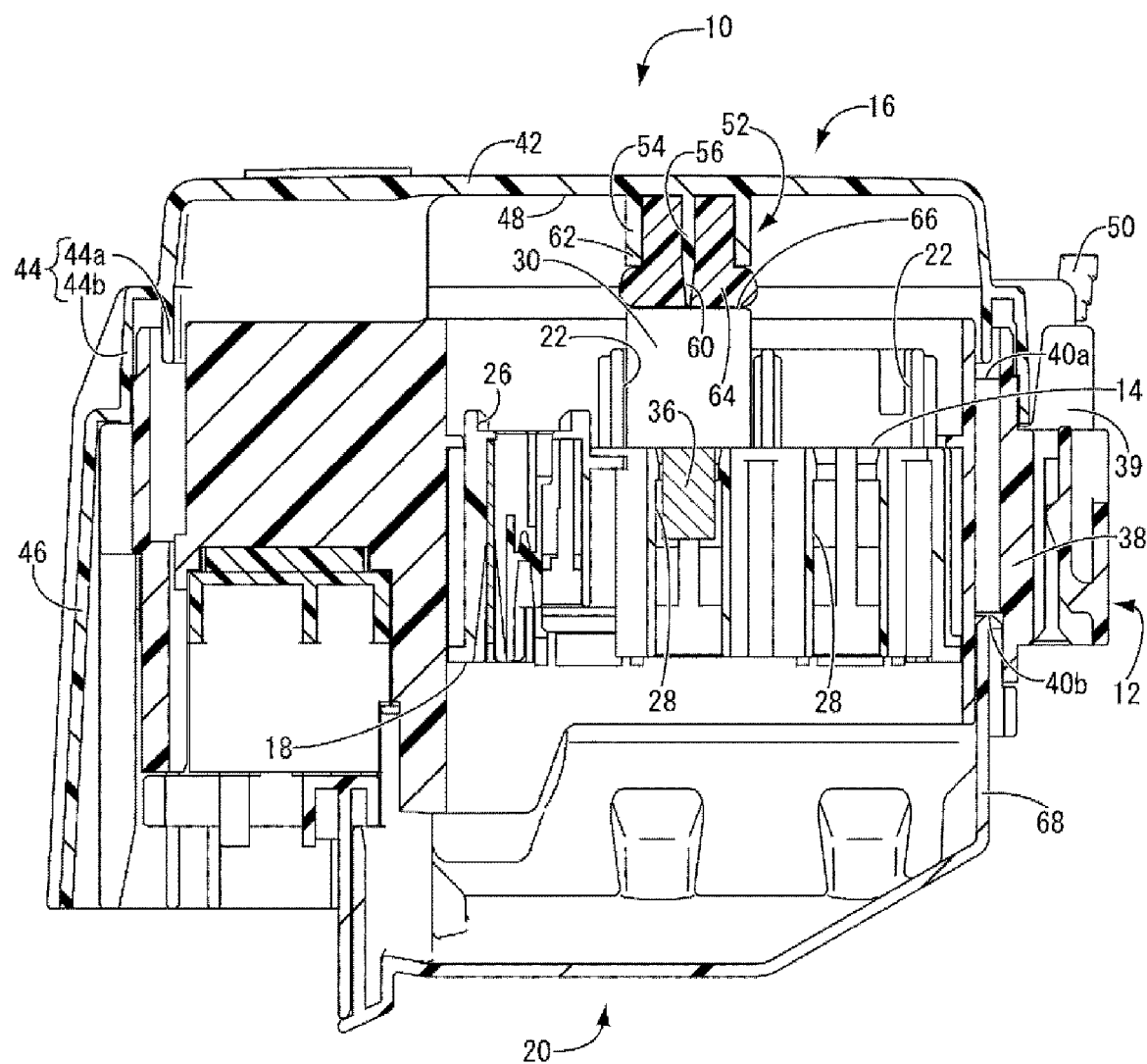
FIG. 3 is an expanded view of a cross-section taken along line III-III in FIG. 1.

FIGS. 1 to 5 show an electrical connection box 10 serving as Embodiment 1 of the present disclosure. More specifically, as shown in FIGS. 2 and 3, the electrical connection box 10 is constituted by including a box main body 12, an upper cover 16, which is a cover member for covering a surface 14 of the box main body 12, and a lower cover 20 for covering a back surface 18 of the box main body 12. Note that in the following description, "upper" refers to the upper side in FIGS. 2 and 3, "lower" refers to the lower side in FIGS. 2 and 3, "frontward" refers to the right side in FIG. 1, "rearward" refers to the left side in FIG. 1, "longitudinal direction" refers to the left-right direction in FIG. 1, and "width direction" refers to the up-down direction in FIG. 1.

As shown in FIGS. 1 to 3, the box main body 12 has an elongated rectangular block shape overall, and for example, is formed integrally through injection molding or the like using an insulating synthetic resin such as polypropylene (PP) or polyamide (PA). Relay mounting portions 22, a fusible link mounting portion 24, and fuse mounting portions 26 that form component mounting portions are provided opening upward in the surface 14 of the box main body 12. As shown in FIGS. 2 and 3, multiple terminal accommodation holes 28 are formed opening downward in the back surface 18 of the box main body 12, and terminal fittings connected to the terminal ends of wires (not shown) are accommodated and arranged in the terminal accommodation holes 28. Also, in the box main body 12, bus bars (not shown) constituting an internal circuit are accommodated and arranged in bus bar accommodation grooves (not shown) or the like.

Starting from the surface 14 side of the box main body 12, relays 30, a fusible link 32, and fuses (not shown), which are electrical components, are mounted in the relay mounting portions 22, the fusible link mounting portion 24, and the fuse mounting portions 26. Accordingly, tab terminals 36 that protrude downward from the relays 30, the fusible link 32, and the fuses are electrically connected to terminal fittings, bus bars, and the like provided at the terminal ends of the above-described wires.

Also, as shown in FIGS. 1 and 3, locked portions 39 for locking and fixing the upper cover 16 for covering the surface 14 of the box main body 12 are provided protruding outward at upper end portions of portions of the box main body 12, the portions being located opposite to each other diagonally in the longitudinal direction of the peripheral wall portion 38. Also, locking portions (not shown) for locking and fixing the lower cover 20 for covering the back surface 18 of the box main body 12 are provided protruding outward at lower end portions of the peripheral wall portion 38 of the box main body 12.

In addition, as shown in FIGS. 2 and 3, the peripheral wall portion 38 of the box main body 12 has a double wall structure. Also, the peripheral wall portion 38 of the box main body 12 includes an upper recessed groove 40a that is provided at the upper end portion of the peripheral wall portion 38 and opens upward due to the double wall structure, and a lower recessed groove 40b that is provided at the lower end portion of the peripheral wall portion 38 and opens downward due to the double wall structure.

Figure 4:
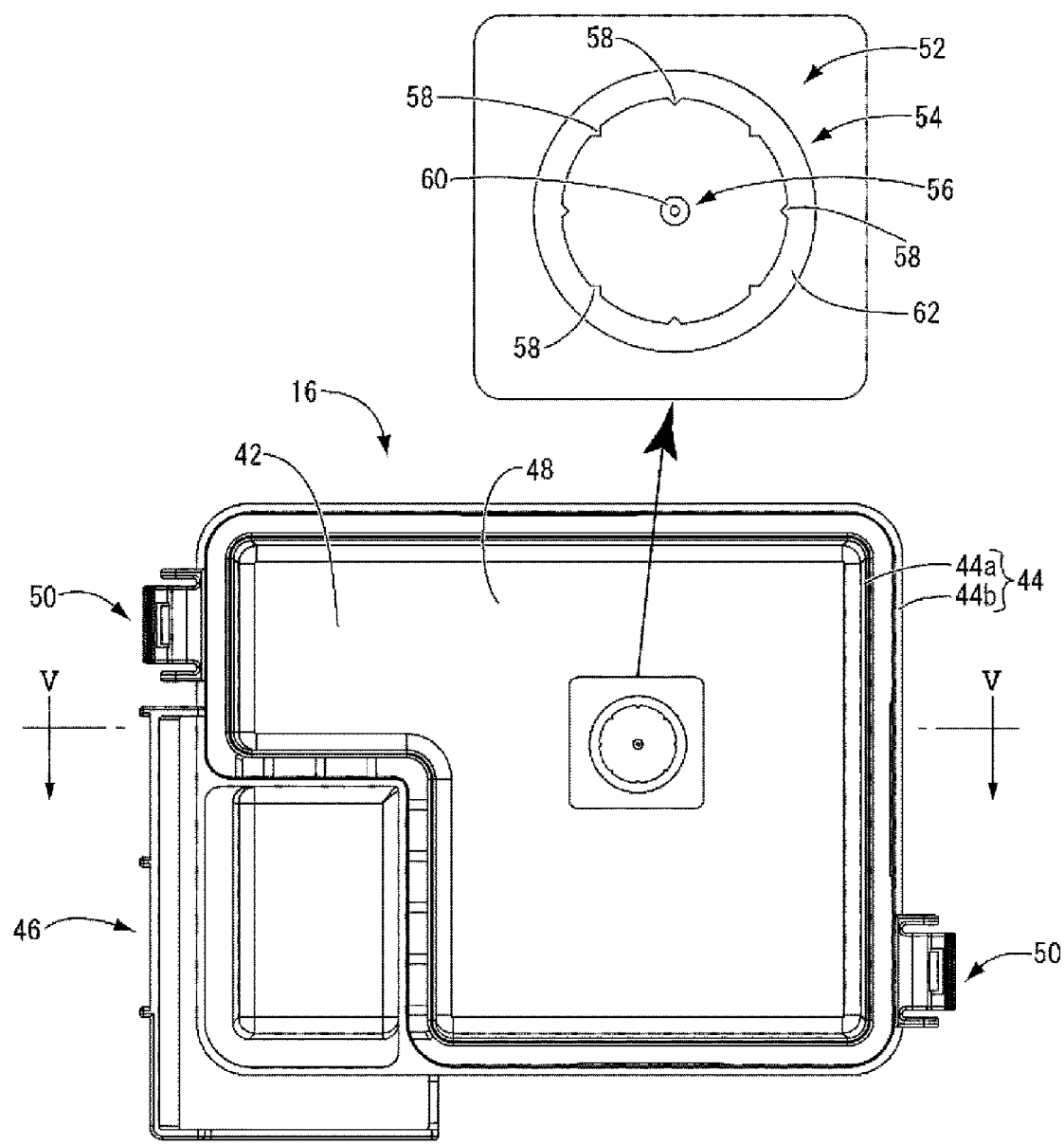
FIG. 4 is a bottom view of a cover member shown in FIG. 1.
Figure 5:
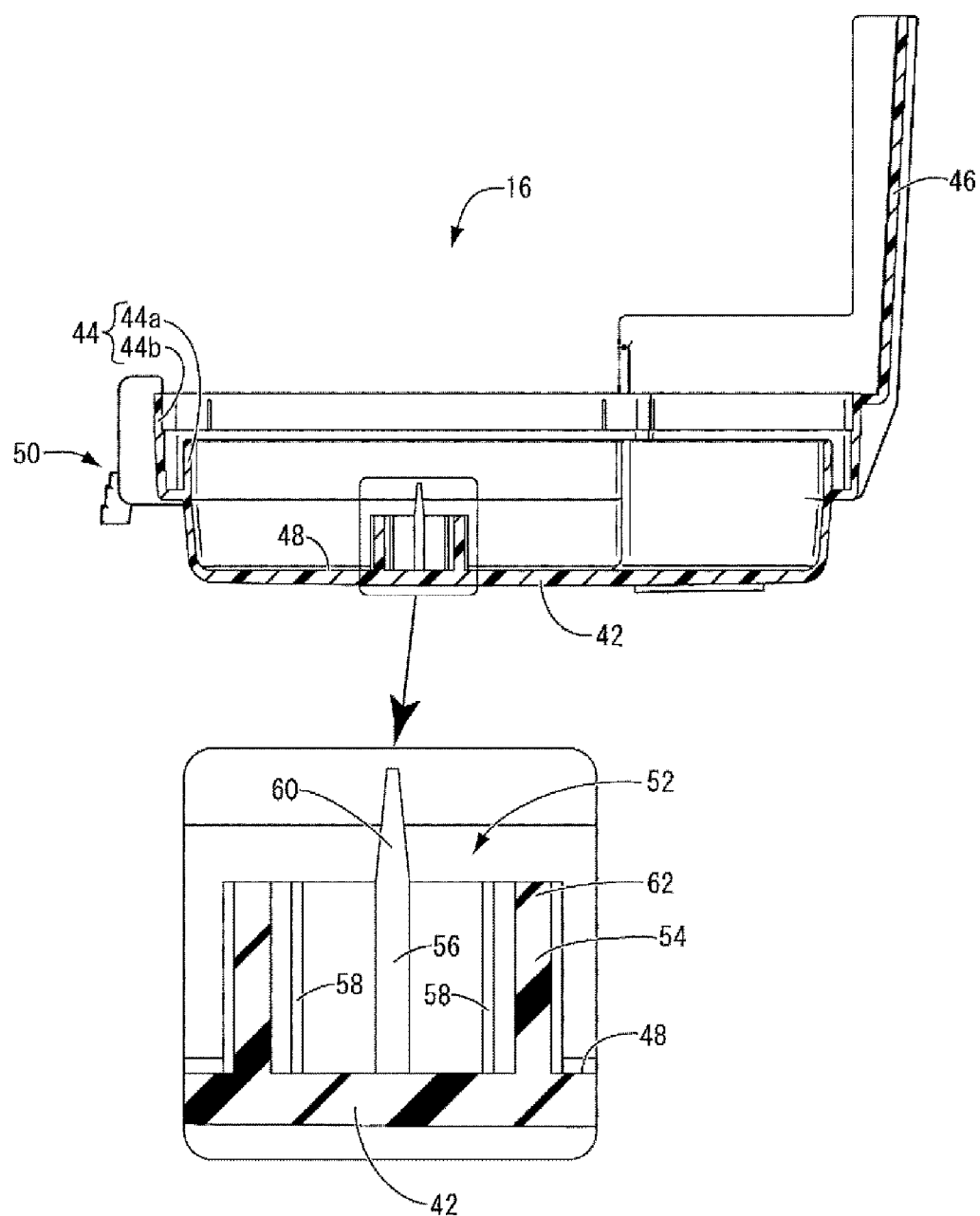
FIG. 5 is a diagram of a cross-section taken along line V-V in FIG. 4.

As shown in FIGS. 1 to 5, the upper cover 16 has a substantially rectangular box shape that opens downward overall, and an integrally molded object made of a synthetic resin. More specifically, as shown in FIGS. 4 and 5, the upper cover 16 includes a top wall portion 42 that is substantially rectangular in the longitudinal direction, and two peripheral wall portions 44 and 46 that protrude downward from an outer peripheral edge portion of the top wall portion 42. The two peripheral wall portions 44 and 46 are provided at positions on the inner surface 48 of the top wall portion 42 that correspond to the peripheral wall portion 38 of the box main body 12. Also, the two peripheral wall portions 44 and 46 include a double wall portion 44 surrounding a substantially reverse L-shaped region in a bottom view, and a cover wall portion 46 that protrudes downward from an outer peripheral edge portion of a region (on the front left side in FIG. 4) of the inner surface 48 of the top wall portion 42 that is not surrounded by the double wall portion 44. As shown in FIGS. 2 to 5, the double wall portion 44 is configured such that an inner wall portion 44a and an outer wall portion 44b that extend in the circumferential direction are spaced apart from each other. The outer wall portion 44b protrudes downward more than the inner wall portion 44a does (see FIGS. 2 and 3), advantageously preventing water and the like from entering from the outside. As shown in FIG. 3, for example, the cover wall portion 46 protrudes further downward than the outer wall portion 44b of the double wall portion 44 does. Accordingly, a configuration is adopted in which the entire peripheral wall portion 38 side of the box main body 12 on the front side (the left side in FIG. 3) is completely covered. The peripheral wall portion 38 on the front side of the box main body 12 is provided with a power source connection portion to which a power source input terminal (not shown) connected to a positive power source of a battery or a positive power source of an alternator is fastened with a bolt, for example.

Also, as shown in FIGS. 1, 3, and 4, locking portions 50 that are to be locked to the locked portions 39 protrude outward from lower end portions of portions of the double wall portion 44 constituting the peripheral wall portion of the upper cover 16, the portions being located opposite to each other diagonally in the longitudinal direction, at positions corresponding to the locked portions 39 provided on the box main body 12.

Also, as shown in FIGS. 2 to 5, the inner surface 48 of the top wall portion 42 of the upper cover 16 is provided with a heat dissipation member holding portion 52 that protrudes toward the relay 30. More specifically, the heat dissipation member holding portion 52 includes a substantially cylindrical peripheral wall portion 54 that protrudes from the inner surface 48 of the top wall portion 42 toward the box main body 12 side, and an axial portion 56 that is located in an inner portion of the peripheral wall portion 54 and extends in the axial direction of the peripheral wall portion 54 (a direction perpendicular to the paper plane passing through the center of the peripheral wall portion 54 in a bottom view in FIG. 4). That is, the axial portion 56 is arranged concentrically with the peripheral wall portion 54. In addition, ribs 58 protrude from the inner surface of the peripheral wall portion 54, the ribs 58 extending in parallel to the axial direction and in substantially triangular cross-sectional shapes at eight positions that are arranged separate from each other at equal intervals in the peripheral direction (see FIG. 4). Also, the leading end portion of the axial portion 56 has a tapered portion 60 that tapers off toward the box main body 12 side overall, and extends further toward the box main body 12 side than the protruding end portion 62 of the peripheral wall portion 54 (see FIGS. 2 and 3) does.

As shown in FIGS. 2 and 3, the heat dissipation member holding portion 52 having such a configuration is filled with the plastic heat dissipation member 64, and the plastic heat dissipation member 64 is held between the peripheral wall portion 54 and the axial portion 56. When the heat dissipation member holding portion 52 is filled with the plastic heat dissipation member 64, the plastic heat dissipation member 64 can be smoothly pushed into the inner portion of the peripheral wall portion 54 of the heat dissipation member holding portion 52, using the leading end portion of the axial portion 56 as a guide because the leading end portion of the axial portion 56 has the tapered portion 60 that tapers off toward the box main body 12 side. Also, because the peripheral wall portion 54 has a cylindrical shape, the heat dissipation member holding portion 52 can be readily filled with the plastic heat dissipation member 64 without gaps. Also, because the ribs 58 protrude from the inner surface of the peripheral wall portion 54, the area of contact of the plastic heat dissipation member 64 with the peripheral wall portion 54 is increased, and the plastic heat dissipation member 64 can be stably and advantageously held by the heat dissipation member holding portion 52. Furthermore, because the peripheral wall portion 54 and the axial portion 56 of the heat dissipation member holding portion 52 are disposed concentrically, it is possible to evenly fill the inner portion of the peripheral wall portion 54 with the plastic heat dissipation member 64, and the plastic heat dissipation member can be stably and advantageously held. Note that a silicone putty sheet for heat dissipation that is in a clay-like state and favorably adheres to unevenness, silicone grease for heat dissipation, or the like is used as the plastic heat dissipation member 64, for example. Also, a portion of the plastic heat dissipation member 64 protrudes from the protruding end portion 62 of the peripheral wall portion 54 that constitutes the heat dissipation member holding portion 52 toward the relay 30, and is made to come into contact with a surface 66 of the relay 30.

When such an upper cover 16 is attached to cover the surface 14 of the box main body 12, as shown in FIGS. 2 and 3, the inner wall portion 44a of the double wall portion 44 of the upper cover 16 is inserted into the upper recessed groove 40a in the peripheral wall portion 38 of the box main body 12. Accordingly, the locking portions 50 of the upper cover 16 are engaged with the locked portions 39 of the box main body 12, and the upper cover 16 is locked and fixed thereto in a state in which the upper cover 16 covers the surface 14 of the box main body 12.

The lower cover 20 is an integrally molded object made of a synthetic resin, and as shown in FIGS. 2 and 3, has an approximate box shape that opens upward. Also, a locked portion 70 for engaging with the locking portion of the box main body 12 and fixing and holding the back surface 18 of the box main body 12 in a state in which the back surface 18 is covered protrudes outward from an upper end portion of the peripheral wall portion 68 of the lower cover 20 at a position corresponding to the locking portion (not shown) of the box main body 12.

According to the electrical connection box 10 with this configuration, the heat dissipation member holding portion 52 protrudes toward the relay 30 from the inner surface 48 of the top wall portion 42 of the upper cover 16, and the plastic heat dissipation member 64 with which the heat dissipation member holding portion 52 is filled is made to come into contact with the surface 66 of the relay 30. The plastic heat dissipation member 64 that is made to come into contact with the surface 66 of the relay 30 has plasticity. Accordingly, it is possible to reduce the contact pressure applied when the relay 30 comes into contact with the surface 66. Also, the plastic heat dissipation member 64 can be stably brought into contact with the surface 66 of the relay 30 due to the plastic heat dissipation member 64 deforming along the surface 66 of the relay 30. Thus, it is possible to avoid or reduce the risk that relay 30 will be damaged, and to efficiently release heat generated by the relay 30 to the outside of the electrical connection box 10 via the plastic heat dissipation member 64 and the top wall portion 42 of the upper cover 16.

Also, the heat dissipation member holding portion 52 includes the peripheral wall portion 54 and the axial portion 56 provided in the inner portion of the peripheral wall portion 54. Therefore, it is possible to sandwich the plastic heat dissipation member 64 between the peripheral wall portion 54 and the axial portion 56, and to stably hold the plastic heat dissipation member 64 in the inner portion of the peripheral wall portion 54 of the heat dissipation member holding portion 52. Also, a portion of the plastic heat dissipation member 64 protrudes from the protruding end portion 62 of the peripheral wall portion 54 of the heat dissipation member holding portion 52 toward the relay 30, and is made to come into contact with the surface 66 of the relay 30. Accordingly, it is possible to advantageously realize effects such as a reduction in the contact pressure of the plastic heat dissipation member 64 applied to the surface 66 of the relay 30 and an increase in the area of contact between the plastic heat dissipation member 64 and the surface 66 without deteriorating the plasticity of the plastic heat dissipation member 64.

In addition, the leading end portion of the axial portion 56 extends further toward the box main body 12 side than the protruding end portion 62 of the peripheral wall portion 54 does. This makes a portion of the plastic heat dissipation member 64 protrude from the protruding end portion 62 of the peripheral wall portion 54 toward the relay 30, and to reliably and readily bring the plastic heat dissipation member 64 into contact with the surface 66 of the relay 30.

Other

Although Embodiment 1 was described in detail above as a specific example of the present disclosure, the present disclosure is not limited by this specific description. Modifications, improvements, and the like within a range in which the object of the present disclosure can be achieved are included in the present disclosure. The following embodiment is also included in the technical scope of the present disclosure, for example.

Figure 6:
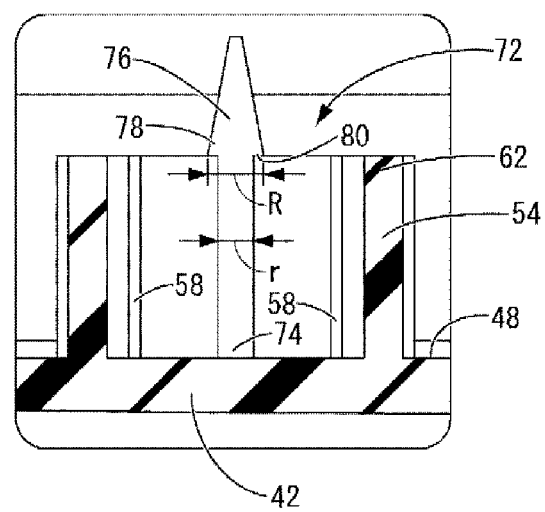
FIG. 6 is an expanded cross-sectional view showing another embodiment of a heat dissipation member holding portion according to Embodiment 1, FIG. 6 corresponding to an insertion figure shown in FIG. 5.

(1) In the above-described embodiment, the leading end portion of the axial portion 56 of the heat dissipation member holding portion 52 has the tapered portion 60 that tapers off toward the box main body 12 side overall. As with an axial portion 74 of a heat dissipation member holding portion 72 as another mode of this embodiment shown in FIG. 6, a tapered portion 76 provided at a leading end portion of the axial portion 74 may have a wide portion 78 (R>r in FIG. 6) whose size in a direction perpendicular to the axis is larger than that of the axial portion 74, and a step surface 80 may be formed between the wide portion 78 and the axial portion 74. Accordingly, the step surface 80 formed between the wide portion 78 and the axial portion 74 of the tapered portion 76 exerts an anchor function, and it is possible to more stably hold a portion of the plastic heat dissipation member 64 that protrudes from the peripheral wall portion 54 of the heat dissipation member holding portion 72. Note that the step surface 80 is not limited to a surface parallel to the inner surface 48 of the top wall portion 42 shown in FIG. 6. The step surface 80 may be inclined toward the inner surface 48 of the top wall portion 42, or may be inclined toward a direction away from the inner surface 48 of the top wall portion 42. Also, although the peripheral wall portions 54 of the heat dissipation member holding portions 52 and 72 have a cylindrical shape in the above-described embodiments, any shapes such as a quadrangular shape, a polygonal shape, a cross shape, and a star shape can be adopted as the shape of the peripheral wall portion 54.

LIST OF REFERENCE NUMERALS

10 Electrical connection box
12 Box main body
14 Surface
16 Upper cover (cover member)
22 Relay mounting portion (component mounting portion)
24 Fusible link mounting portion (component mounting portion)
26 Fuse mounting portion (component mounting portion)
28 Terminal accommodation hole
30 Relay (electrical component)
32 Fusible link (electrical component)
42 Top wall portion
48 Inner surface
52, 72 Heat dissipation member holding portion
54 Peripheral wall portion
56, 74 Axial portion
58 Rib
60, 76 Tapered portion
62 Protruding end portion
64 Plastic heat dissipation member
66 Surface
78 Wide portion
80 Step surface

What is claimed is:

1. An electrical connection box comprising:
  a box main body having a surface provided with a component mounting portion in which an electrical component is mounted; and
  a cover covering the surface of the box main body;
  wherein an inner surface of a top wall portion of the cover is provided with a heat dissipator holding portion that protrudes toward the electrical component, and a plastic heat dissipator held by the heat dissipator holding portion is made to come into contact with a surface of the electrical component, and
  wherein the heat dissipator holding portion includes a tubular peripheral wall portion that protrudes from the inner surface of the top wall portion toward the box main body side, and an axial portion that is located in an inner portion of the peripheral wall portion and extends in an axial direction of the peripheral wall portion, and a portion of the plastic heat dissipator protrudes from the heat dissipator holding portion toward the electrical component to come into contact with the surface of the electrical component.

2. The electrical connection box according to claim 1, wherein the peripheral wall portion has a cylindrical shape, and the axial portion is arranged concentrically therewith.

3. The electrical connection box according to claim 1, wherein a rib extending in parallel to the axial direction protrudes from an inner surface of the peripheral wall portion.

4. The electrical connection box according to claim 1, wherein a leading end portion of the axial portion extends further toward the box main body side than a protruding end portion of the peripheral wall portion does.

5. The electrical connection box according to claim 1, wherein the leading end portion of the axial portion has a tapered portion that tapers off toward the box main body side.

6. The electrical connection box according to claim 5, wherein the tapered portion of the axial portion has a wide portion having size in a direction perpendicular to the axial direction that is larger than that of the axial portion, and a step surface is formed between the wide portion and the axial portion.

* * * * *